United States Patent [19]
Alfaro et al.

[11] Patent Number: 5,650,915
[45] Date of Patent: Jul. 22, 1997

[54] THERMALLY ENHANCED MOLDED CAVITY PACKAGE HAVING A PARALLEL LID

[75] Inventors: Rafael Cesar Alfaro, Carrollton; Katherine Gail Heinen, Dallas; Paul Joseph Hundt, Garland, all of Tex.

[73] Assignee: Texas Instruments Incorporated, Dallas, Tex.

[21] Appl. No.: 660,386

[22] Filed: Jun. 7, 1996

Related U.S. Application Data

[60] Continuation of Ser. No. 473,163, Jun. 7, 1995, abandoned, which is a division of Ser. No. 248,986, May 25, 1994, Pat. No. 5,458,716.

[51] Int. Cl.$^6$ ............................................. H05K 7/20
[52] U.S. Cl. ........................... 361/707; 257/710; 361/705
[58] Field of Search ............................. 174/252, 16.3, 174/52.4; 165/80.3, 185; 257/706, 707, 710, 713, 720; 361/813, 688, 704, 705, 707, 710–712, 718, 722, 723

[56] References Cited

U.S. PATENT DOCUMENTS

| | | | |
|---|---|---|---|
| 4,099,200 | 7/1978 | Koutalides | 357/69 |
| 4,890,152 | 12/1989 | Hirata | 357/72 |
| 5,261,157 | 11/1993 | Chang | 29/844 |
| 5,264,393 | 11/1993 | Tamara | 437/209 |
| 5,293,301 | 3/1994 | Tanaka | 361/707 |
| 5,379,187 | 1/1995 | Lee | 361/707 |
| 5,444,909 | 8/1995 | Mehr | 29/827 |
| 5,471,011 | 11/1995 | Maslakow | 174/52.4 |

*Primary Examiner*—Gerald P. Tolin
*Attorney, Agent, or Firm*—Stanton C. Braden; W. James Brady, III; Richard L. Donaldson

[57] ABSTRACT

The present invention provides a thermally enhanced molded cavity package (10) having a package body (12) with upper (40) and lower (42) sections. The package body (12) has a cavity (22) with the cavity opening (32) in the upper section (40) of the package body (12). The present package (10) includes a lead frame (14) with a plurality of individual leads (16) that are external to the cavity (22) and a plurality of lead fingers (28) that are internal to the cavity (22). The present package (10) also includes a heat spreader (34) for increasing heat dissipation from the package (10) in the lower section (42) of the package body (12) and coupled to the lead frame (14). The heat spreader (34) has a first surface (26) forming a floor of the cavity upon which a microcircuit chip (24) may be mounted and a second surface forming a base (36) of the package body (12). The upper section (40) of the package body (12) includes a lid seat (33) for supporting a lid (30) and for maintaining the lid (30) parallel to the floor (26) of the cavity when the lid (30) is placed in the cavity opening (32).

14 Claims, 3 Drawing Sheets

THERMALLY ENHANCED MOLDED CAVITY PACKAGE HAVING A PARALLEL LID

This application is a continuation of application Ser. No. 08/473,163, filed Jun. 7, 1995, now abandoned which application Ser. No. 08/248,986, filed May 25, 1994, now U.S. Pat. No. 5,458,716, issued on Oct. 17, 1995.

TECHNICAL FIELD OF THE INVENTION

This invention relates in general to the field of electronic devices, and more particularly to an improved molded cavity package having a parallel lid and method for manufacturing the package.

BACKGROUND OF THE INVENTION

Packaging semiconductor integrated microcircuits generally entails enclosing the microcircuit chip in one of two package types; ceramic or plastic. High-reliability or high power applications of microcircuits generally use ceramic packages. Ceramic packages can provide a hermetic seal preventing exposure of the microcircuit chip within the package to moisture or other contaminants. Ceramic packaging, however, has high material costs, high assembly costs, and high labor costs. High volume, low cost, commercial applications of microcircuits, therefore, generally do not use ceramic packages.

In contrast, plastic packaging provides the brunt of the low cost, high volume packages used in commercial electronics today. Unfortunately, the inability of plastic to effectively dissipate high levels of power from a microcircuit chip makes plastic packages unsuitable for some applications. Additionally, forming a plastic package requires sealing the microcircuit chip in a molding compound at an elevated temperature. Either the molding temperature or molding compounds may not be compatible with the microcircuit chip.

Some classes of semiconductor microcircuits require a window or lens above the microcircuit chip for proper operation. For example, in erasable programmable read-only memories (EPROMS) and programmable array logic (PAL) devices, ultra-violet (UV) light erases or clears the device.

A new type of microcircuit that transmits or reflects light from the surface of the chip through a window or lens in the package has been developed. A Digital Micromirror Device (DMD) reflects light transmitted through the package window. DMDs have been developed for use in, among other applications, high definition television (HDTV). Details on DMDs may be found in U.S. Pat. No. 5,061,049, issued to Hornbeck from patent application Ser. No. 07/582,804, and assigned to Texas Instruments Incorporated. U.S. Pat. No. 5,061,049 is expressly incorporated by reference for all purposes.

Proper operation of devices that transmit or reflect light through a package window require nearly perfect parallelism between the lens or window and the surface of the microcircuit chip. Failing to achieve parallelism between the lens and chip surface may result in unacceptable reflection or refraction of light from the chip surface. Additionally, because the chip may reflect substantial amounts of light energy, the chip and package must dissipate power efficiently. The inability to dissipate power efficiently may cause the temperature of the chip to exceed a level where it may be damaged.

To date, light reflecting and transmitting microcircuits have been primarily packaged in ceramic cavity packages. Because of the rigid structure of a ceramic package, achieving parallelism between the chip surface and the lens or window is possible. As previously noted, ceramic packages dissipate power effectively and, therefore, meet this additional requirement for light transmitting or reflecting microcircuits. Unfortunately, the expense of ceramic cavity packages makes them unsuitable for low cost systems using light transmitting devices like DMDs.

Low cost, high volume plastic packaging has thus far proven unacceptable for DMDs. Most previously developed plastic packages lack sufficient power dissipating capability for use with DMDs. Additionally, the molding temperature for most plastic compounds (approximately 180° C.) may damage some microcircuits, including DMD devices. Therefore, using plastic packages for these devices requires pre-forming a plastic cavity package in which the chip is later placed. Previously developed techniques for pre-forming plastic cavity packages do not provide or ensure parallelism between the lens or window covering the cavity and microcircuit chip surface.

SUMMARY OF THE INVENTION

Therefore, a need has arisen for a thermally enhanced molded cavity package having a parallel lid.

A need further exists for a low cost thermally enhanced molded cavity package.

An additional need exists for a method of manufacturing a high volume, low cost thermally enhanced molded cavity package having a parallel lid.

In accordance with the present invention, a thermally enhanced molded cavity package having a parallel lid and a method for manufacturing the package are provided that substantially eliminate or reduce disadvantages and problems associated with previously developed molded cavity packages and manufacturing methods.

One embodiment of the present invention is a thermally enhanced molded cavity package having a package body with upper and lower sections. The package body has a cavity with the cavity's opening in the upper section of the package body. The present package also includes a lead frame having a plurality of individual leads external to the cavity and a plurality of lead fingers internal to the cavity. The present package also includes a heat spreader in the lower section of the package body and coupled to the lead frame. The heat spreader increases heat dissipation from the package. A first surface of the heat spreader forms the cavity floor and a second surface forms a base of the package body. The upper section of the package body includes a lid seat for supporting a lid and maintaining the lid parallel to the floor of the cavity when the lid is placed in the cavity opening.

Another aspect of the present invention is a method for forming a thermally enhanced molded cavity package for housing a microcircuit chip. The package includes a lid and a heat spreader. The heat spreader has upper and lower surfaces attached to a lead frame. The lead frame includes a plurality of individual leads and a plurality of lead fingers.

The method for forming the present package includes molding a package body having upper and lower sections around the heat spreader and lead frame in a mold press by injecting molding compound into the mold press. The mold press clamps to the lower surface of the heat spreader and to the lead frame so as to define a cavity in the package body during the molding process. The upper surface of the heat spreader forms the cavity floor and the press defines a lid seat in the upper section of the package body for supporting the lid and maintaining the lid parallel to the cavity floor during forming of the package body. The plurality of individual leads of the lead frame are external to the cavity and the plurality of lead fingers are internal to the cavity.

A technical advantage of the present molded cavity package is reduce cost with respect to ceramic cavity packages that would otherwise be required for packaging DMD-type devices. The present molded cavity package can be manufactured using commercially available materials, processes, and equipment. Moreover, the method of manufacturing the present molded cavity package is suitable for commercial, high volume quantities. All of these factors provide the present molded cavity package with a technical advantage of low cost.

An additional technical advantage of the present molded cavity package is enhanced power dissipation through integration of a heat spreader into the package body. Increasing power dissipation from the package helps maintain a microcircuit in the package at a lower temperature. Lowering the temperature of a microcircuit generally increases the life and reliability of the microcircuit. For a light reflecting or transmitting device, the present invention aids in maintaining the device in its safe operating temperature range thereby preventing thermal damage to the device.

The present package provides another technical advantage of maintaining a lens or lid nearly or exactly parallel to the surface of a chip mounted in the package. This makes the present molded cavity package suitable for microcircuit applications that transmit or reflect light from the surface of the chip.

Forming the present package body prior to placing the chip in the package provides an additional technical advantage of eliminating exposure of the microcircuit chip to sometimes harmful molding temperatures. Additionally, by inserting the microcircuit into the package after forming the package allows for use of standard molding compounds and processes.

An additional technical advantage of the method for forming the present molded cavity package is that it generally does not require any machining after forming. The present method results in a package formed to net dimensions. The present method provides another technical advantage of being suitable for forming a wide variety of packages. The present method forms quad flat-pack, dual in-line package (DIP), or leadless chip carrier (LCC) type packages equally well.

BRIEF DESCRIPTION OF THE DRAWINGS

For a more complete understanding of the present invention and advantages thereof, reference is now made to the following description taken in conjunction with the accompanying drawings in which the reference numbers indicate like features and wherein.

DETAILED DESCRIPTION OF THE INVENTION

Preferred embodiments of the present invention are illustrated in the FIGURES, like numbers being used to refer to like and corresponding parts of the various drawings.

Figure 1A:
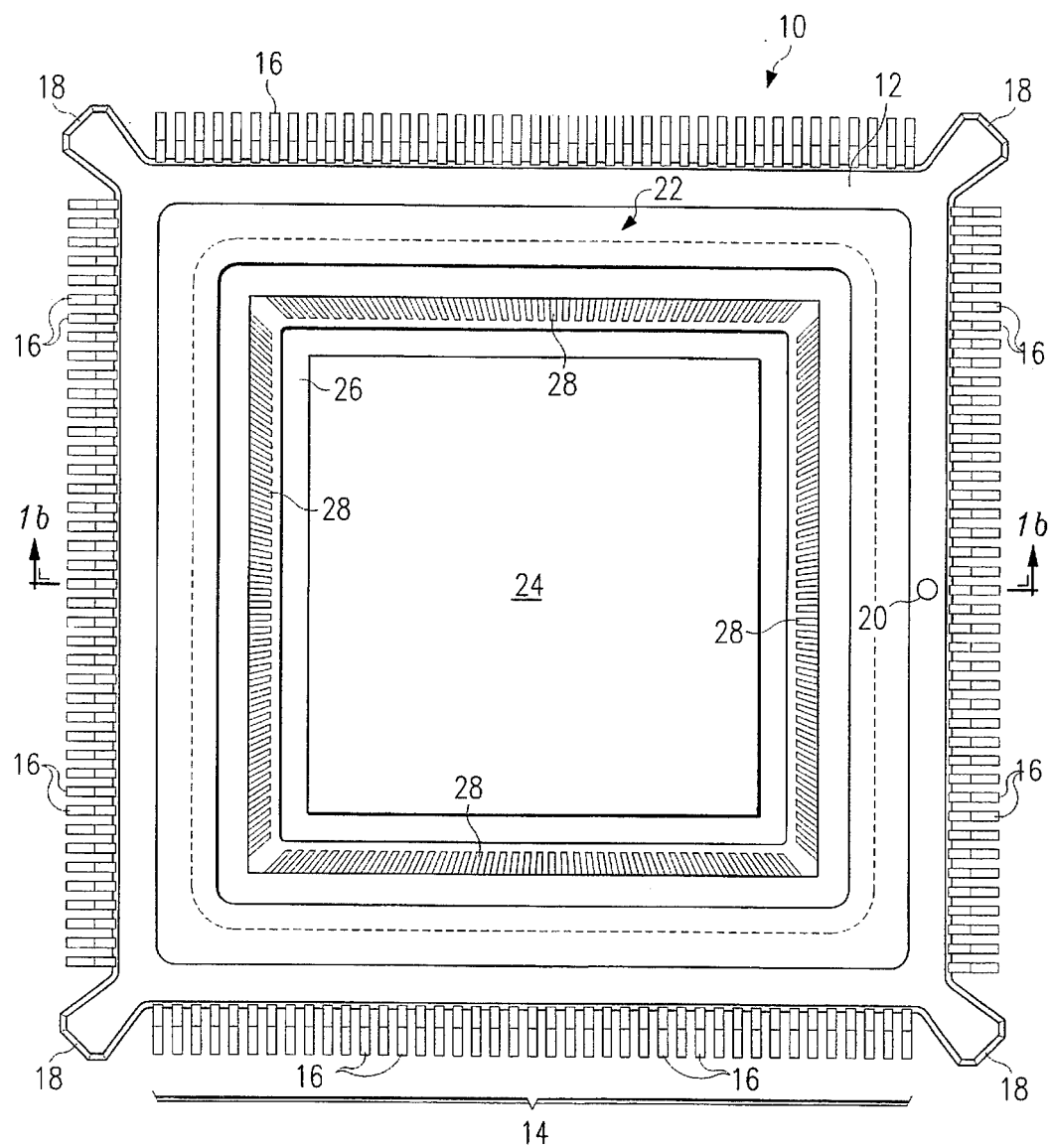
FIGS. 1a and 1b illustrate a topical and cross-sectional view, respectively, of the present thermally enhanced molded cavity package.

FIG. 1a shows a topical view of thermally enhanced molded cavity package 10. Package 10 includes package body 12 with lead frame 14 having individual leads 16. Package body 12 also includes four lead stand-offs 18 that protect individual leads 16. Circle 20 on package body 12 is the pin 1 identifier for package 10.

Within package body 12 is cavity 22, and in cavity 22 is microcircuit chip 24. Chip 24 is placed on base 26 which is the top surface of a heat spreader in some embodiments of the present molded cavity package. Also within cavity 22 of package body 12 are lead fingers 28. Lead fingers 28 are an extension of lead frame 14 and provide an electrical path between chip 24 and leads 16 when bond wires (not explicitly shown) are placed between chip 24 and lead fingers 28.

Figure 1B:
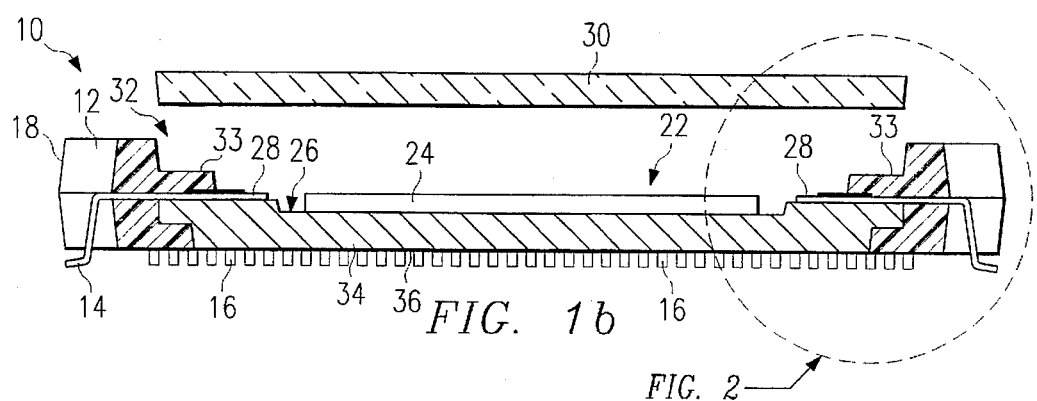

FIG. 1b shows a cross-sectional view taken from FIG. 1a where noted. Molded cavity package 10 includes lid 30 shown slightly displaced from package body 12 for illustrative purposes only. Lid 30 may be a window or lens of glass or plastic, or any other suitable material for transmitting light. Lid 30 fits into opening 32 of cavity 22 where it is supported by lid seats 33.

Also included in package body 12 is heat spreader 34, which may be formed from aluminum, copper, or any other suitable thermally conductive material. Heat spreader 34 is generally formed from a material that is reasonably matched with the coefficients of thermal expansion for lead frame 14 and the molding material of package body 12. Chip 24 is shown placed directly against base 26 of heat spreader 34 in FIG. 1b. Power dissipated by chip 24 conducts through base 26 and into heat spreader 34 where it is dissipated through the bottom surface 36 of heat spreader 34. In this way, heat spreader 34 dissipates power from microcircuit chip 24 through the medium to which surface 36 is placed. Bottom surface 36 of heat spreader 34 may be textured with ridges or other protrusions that increase the surface area of heat spreader 34 so as to increase its heat dissipating capability.

Figure 2:
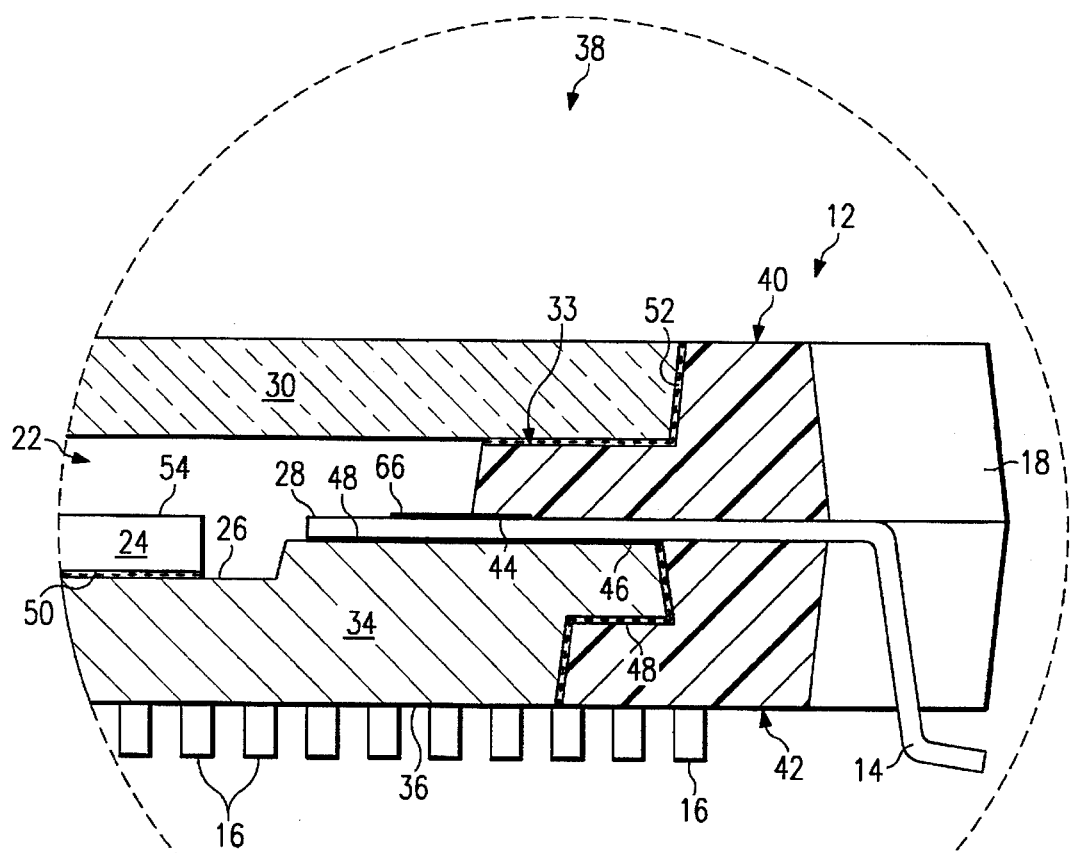
FIG. 2 shows an enlarged cross-sectional view from FIG. 1b.

FIG. 2 shows enlarged cross-sectional view 38 of package 10 and chip 24 as noted from FIG. 1b. Package body 12 includes upper package body 40 and lower package body 42. Both package bodies are actually a single molded piece that is formed during a single step. Upper package body 40 contacts lead fingers 28 of lead frame 14 and forms lid seat 33. Upper insulator 44 forms an interface between upper package body 40 and lead finger 28 and is applied to lead frame 14 by an appropriate adhesive. Upper insulator 44 acts as a barrier to the flow of molding compound when package body 12 is formed and prevents the molding compound of upper package body 40 from filling cavity 22.

Between lead finger 28 and heat spreader 34 is lower insulator 46. Lower insulator 46 electrically isolates lead finger 28 from heat spreader 34. Insulator 46 prevents electrical conduction between lead finger 28 and heat spreader 34. Insulator 46 also helps adhere heat spreader 34 to lead frame 14 and lead finger 28. Heat spreader 34 and insulator 46 also support lead finger 28 during the formation of bond wires from chip 24 and lead finger 28. The bond wires (not explicitly shown) provide electrical coupling between chip 24 and lead frame 14.

At the interface between heat spreader 34 and lower package body 42 is adhesion enhancement layer 48. Adhesion enhancement layer 48 ensures good adhesion between heat spreader 34 and lower package body 42 for maintaining the integrity of package 10.

Chip 24 is attached to base 26 of heat spreader 34 by attachment adhesive 50. Base 26 should be a nearly planar surface to ensure parallelism between chip 24 and lid 30. In an alternate embodiment, a chip pad (not explicitly shown) may be included between chip 24 and base 26. Chip 24 dissipates power through attachment adhesive 50 into heat spreader 34.

FIG. 2 shows lid 30 placed in opening 32 of cavity 22 and seated on lid seat 33. Lid adhesive 52 adheres lid 30 to lid slid 33 of upper package body 40. A technical advantage of the present molded cavity package is that lid 30 is parallel to top surface 54 of chip 24. Lid 30 can be embodied in a lens or window.

Figure 3:
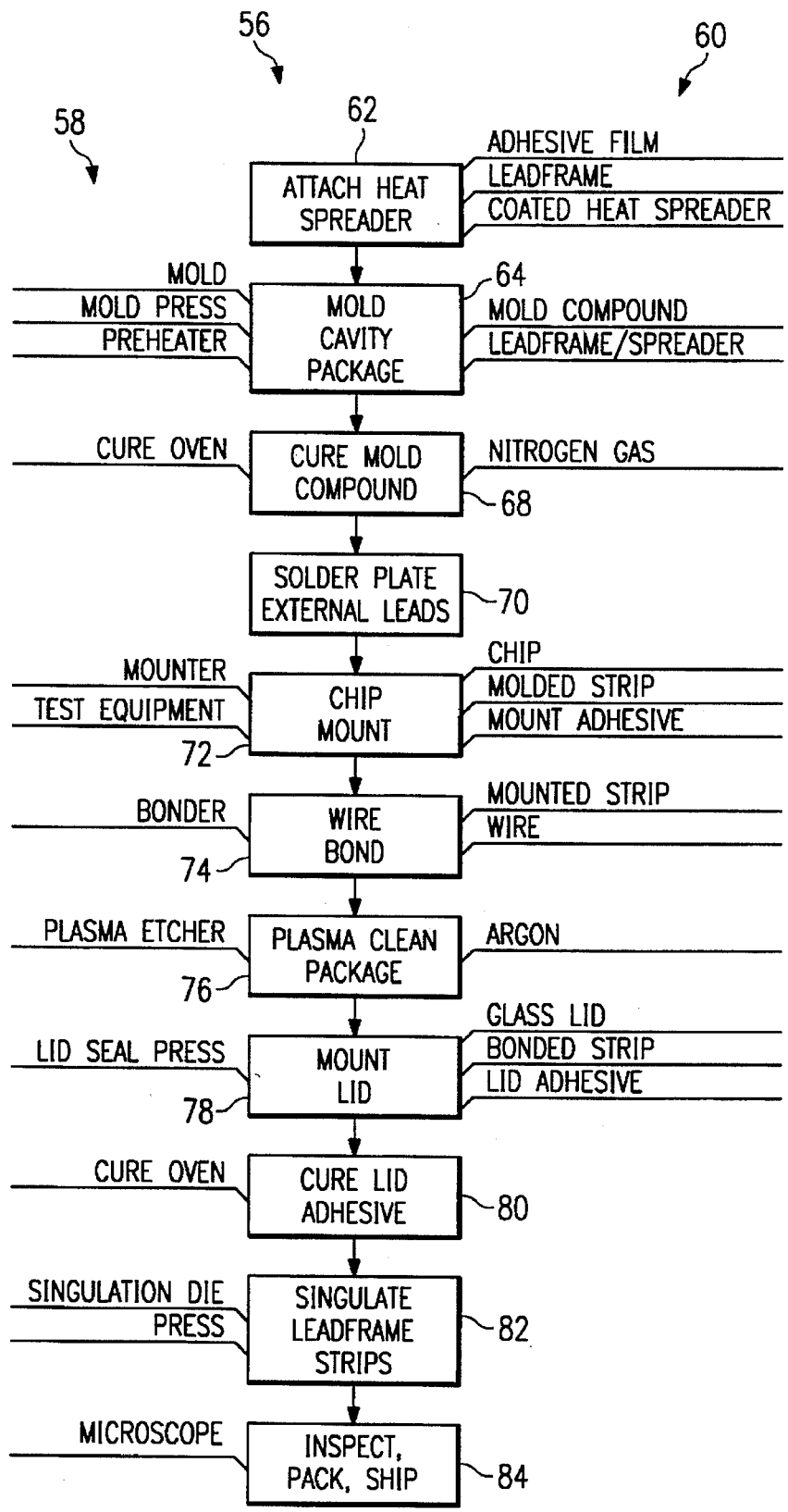
FIG. 3 depicts an exemplary method for fabricating the present molded thermally enhanced cavity package.

FIG. 3 shows an exemplary method 56 for manufacturing the present molded cavity package. In method 56, equipment is shown generally in left-hand column 58 and materials are shown generally in right-hand column 60. The package shown in FIGS. 1a, 1b, and 2, and the referenced designations used in related discussions, will be used to describe method 56 of FIG. 3, it being understood that method 56 is provided as an example only and is not to be construed in a limiting sense.

At step 62, heat spreader 34 is coupled to lead frame 14. At the interface of lead frame 14 and heat spreader 34 is placed insulator 46. Insulator 46 is generally in the form of an adhesive coated film which acts to both electrically insulate lead frame 14 from heat spreader 34 and adhere lead frame 14 to heat spreader 34. Insulator 46 may be embodied in a polyimide tape. "Upilex" and "Kapton" tapes have been found to be suitable for insulator 46.

Additionally in step 62, the surface of heat spreader 34 that contacts the molding compound of lower package body 42 is coated to ensure good adhesion between heat spreader 34 and lower body portion 42. The coating of heat spreader 34 to form adhesion enhancement layer 48 may be accomplished by plasma sputter depositing nickel aluminide, aluminum oxide, or aluminum copper on the surface of heat spreader 34 where it contacts the molding compound of lower package body 42. The formation of adhesion enhancement layer 48 ensures good adhesion between heat spreader 34 and lower package body 42 for maintaining the integrity of package 10. A process for depositing nickel oxide or aluminum oxide by flame plasma coating is described in U.S. patent application Ser. No. 07/931,797, filed Aug. 18, 1992, and U.S. patent application Ser. No. 08/092,659, filed Jul. 15, 1993, both assigned to Texas Instruments Incorporated. These patent applications are incorporated by reference for all purposes herein.

At step 64, package body 12 is formed. Package body 12 is formed by molding a molding compound in a molding press. Lead frame 14 with heat spreader 34 attached (step 62) are placed in a mold press. The molding compound is warmed in a preheater and placed in the mold press. The preheated molding compound is then injected into the mold. Package body 12 is formed in the mold when the molding compound hardens. The molding compound may be either a thermoset or thermoplastic compound. Novalac epoxy resin filled compounds filled with silica to control the coefficient of thermal expansion of the compounds have been found to be suitable molding compounds.

An important step in the formation of package body 12 is ensuring that lid seat 33 is parallel to base 26 of heat spreader 34. Then, when lid 30 is placed in cavity opening 32 on lid seat 33, lid 30 is parallel to base 26 and top surface 54 of chip 24. The parallelism of these two surfaces is ensured during the formation of package body 12 by clamping on top surface 66 of upper insulator 44 with the mold press and bottom surface 36 of heat spreader 34. By this way, when the molding compound is injected into the mold press, the molding compound fills the mold and ensures that lid seat 33 is parallel to top surface 26 of heat spreader 34. Upper insulator 44 also serves as a barrier preventing the injection of molding compound into cavity 22.

Depending on whether a thermoset or a thermoplastic is used for a molding compound, the molding press is held closed in the shape of package body 12 for the necessary period of time. Once the polymers of the molding compound partially cross-link, the mold press is released. It is noted that the inventive concepts of the present invention are not limited to using plastic as the molding compound. Any suitable molding compound may be used in forming the present package.

Package body 12 is formed in a mold press in a single step through the injection of a molding compound. The single step of forming package body 12 ensures that lid seat 33 is parallel to base 26 of heat spreader 34 and that lid 30 subsequently placed in cavity opening 32 and seated on lid seat 33 is parallel to top surface 54 of chip 24. In this manner, the present molded cavity package 10 achieves a technical advantage of parallelism between lid 30 and chip 24. Molded cavity package body containing the lead frame and integrated heat spreader formed in step 64 may be referred to as the molded strip.

Proceeding to step 68, package body 12 formed in step 64 may be cured in a curing oven in an appropriate environment. Nitrogen gas has been found to be an appropriate medium for curing the molding compound of package body 12 in step 68 in order to minimize oxidation of lead frame 14 or heat spreader 34. Curing in step 68 adds additional cross-linking in the polymers of the molding compound. Curing the molding compound of package body 12 at step 68 in nitrogen gas for approximately four hours at, for example 175° C., has been found to be suitable to form present package 10.

At step 70, individual leads 16 of lead frame 14 are solder plated. Solder plating facilitates soldering of package 10 to printed circuit board (PCB). Leads made of Alloy 42 have been found to be suitable for lead frame 14. Solder plating of the external leads 16 with either solder or palladium is acceptable for step 70.

Proceeding to step 72, chip 24 is mounted on base 26 of heat spreader 34 of package body 12 (molded strip). The thickness of die attachment 50 must be controlled to ensure the planarity of top surface 54 of chip 24 to base 26. The thickness of die attachment adhesive 50 may be controlled through the use of a pre-formed adhesive of an appropriate thickness or through an adhesive layer formed from beads of a suitable diameter. The thickness of die attachment 50 is controlled by supporting adhesives and/or beads added to the adhesive to control its collapse when die 24 is placed against the adhesive. Techniques, mounting devices, and test equipment that are known in the art for ensuring a uniform adhesive layer 50 may be used in step 72. Chip 24 mounted in package body 12 may be referred to as the mounted strip.

A technical advantage of the present package is the elimination of a chip pad between chip 24 and heat spreader 34. This eliminates the materials and handling costs in otherwise using a chip pad. A chip pad may be used within the concepts of the present invention without deviating from its inventive concepts.

In step 74, chip 24 in the mounted strip is electrically coupled to lead frame 14 through bonding with a bonder. Gold or aluminum bond wires using bonding techniques known in the art are suitable for forming bond wires in step 74. Once chip 24 in package body 12 has been bonded it may be referred to as a bonded strip.

At step 76, cavity 22 of package body 12, including die 24 and the bond wires formed in step 74, may be cleaned prior to sealing. Cleaning with a plasma etcher may be accomplished by an argon plasma cleaning etching process as is known in the art.

At step 78, lid 30 is mounted in opening 32 of cavity 22 of the bonded strip with a lid seal press. Lid adhesive 52 is used to adhere lid 30 to upper package body 40. Adhesive 52 may be a silver fill epoxy using a pre-form or beads of a predetermined diameter to ensure that adhesive layer 52 will be uniform once lid 30 is pressed against it. This is important to ensure that lid 30 is parallel to die 24.

At step 80, lid adhesive 52 may be cured in a curing oven. Curing time and temperature is dependent on the material of lid adhesive 52.

At step 82, individual leads 16 which are generally mechanically coupled to one another when received, and retained that way during processing, may be separated. Separation or singulation of leads 16 of lead frame 14 may be accomplished with a singulation die in a press.

At step 84, the completed molded cavity package 10 may be inspected prior to packing and shipping and inspection with a microscope may be desirable. The steps identified in FIG. 3 are provided by way of an example only. The present method for forming a molded cavity package is suitable for any type of package and is not limited to the quad flat-packs shown in FIGS. 1a–2. It is also noted that multiple molded cavity packages may be simultaneously formed with the present inventive method.

The present thermally enhanced molded cavity package having a parallel lid is formed by injecting molding compound into a mold press having the heat spreader and lead frame placed therein. By appropriately clamping against the lead frame and heat spreader and by using insulators to electrically insulate the lead frame from the heat spreader and to form molding compound barriers, package body 12 including cavity 22 may, be formed in a single step. By this way, chip 24 on base 26 of heat spreader 34 and lid 30 are parallel one with another.

Technical advantages of the present package include the formation of a molded cavity package with thermal enhancement for improved power dissipation. The method of manufacturing the present package also ensures that the package body and lid are parallel. This makes the present package suitable for use with applications that must either transmit or reflect light through the lid. The present package is manufacturable by available manufacturing processes, material, and equipment. This makes the present package suitable for high volume, low cost applications.

Although the present invention has been described in detail, it should be understood that various changes, substitutions and alterations can be made hereto without departing from the spirit and scope of the invention as defined by the appended claims.

What is claimed is:

1. A thermally enhanced molded cavity package comprising:

a package body comprising an upper section, a lower section, and a cavity with an opening in said upper section, said upper section comprising a lid seat disposed to receive a package lid;

a lead frame coupled to said package body comprising a plurality of individual leads external to said cavity and a plurality of lead fingers internal to said cavity;

a heat spreader operable to facilitate heat dissipation in said lower section, said heat spreader comprising a first surface that defines a cavity floor;

a semiconductor device having an upper surface and a lower surface, the entire lower surface fully contacting said heat spreader cavity floor so as to be fully supported thereby, said heat spreader being coupled to said lead frame; and an optically transparent lid, whereby said lid seat supports said lid and maintains said lid parallel to said semiconductor device upper surface.

2. The package of claim 1 wherein said package body is plastic.

3. The package of claim 1 further comprising an upper insulator forming a barrier to molding compound during forming of said package body.

4. The package of claim 1 further comprising a lower insulator between said lead frame and said heat spreader for electrically isolating said lead frame from said heat spreader and for ensuring adhesion between said lead frame and said heat spreader.

5. The package of claim 1 further comprising an adhesion enhancement layer between said heat spreader and said package body ensuring adhesion between said heat spreader and said package body.

6. The package of claim 1 further comprising a lid adhesive for securing said lid to said lid seat and said package body.

7. The package of claim 1 wherein said lid is one of clear glass and clear plastic.

8. The package of claim 1 wherein said lid is a lens.

9. The package of claim 1 wherein said heat spreader first surface comprises a sidewall that extends from said floor.

10. The package of claim 1 wherein each of said leads is provided with an upper surface that is substantially co-planar with the semiconductor device.

11. The package of claim 1 wherein said heat spreader is bonded to said lower package body section.

12. The package of claim 1 wherein each of said leads is supported by said heat spreader above said heat spreader cavity floor.

13. The package of claim 1 wherein said lower package body section defines a seat operable to support said heat spreader.

14. A molded cavity package for a semiconductor device, comprising:

a package body comprising an upper section, a lower section, and a cavity with an opening in said upper section, said upper section comprising a lid seat disposed to receive a package lid;

a lead frame coupled to said package body comprising a plurality of individual leads external to said cavity and a plurality of lead fingers internal to said cavity, said lead fingers extending between said upper and lower package body sections toward said cavity;

a heat spreader coupled to said lead frame and operable to facilitate heat dissipation in said lower section, said heat spreader comprising a first surface that defines a cavity floor and a second surface that defines a heat spreader base;

a semiconductor device of a type that is operable to receive programming information through the input of optical energy, said semiconductor device having an upper surface and a lower surface, whereby the entire lower surface fully contacts said heat spreader floor so as to be fully supported thereby and said semiconductor device upper surface is substantially co-planar with an upper surface of said lead fingers; and an optically transparent lid, whereby said lid seat supports said lid and maintains said lid parallel to said semiconductor device upper surface.

* * * * *